(12) United States Patent
D'Andrade (10) Patent No.: US 7,728,512 B2
(45) Date of Patent: Jun. 1, 2010

(54) ORGANIC LIGHT EMITTING DEVICE HAVING AN EXTERNAL MICROCAVITY

(75) Inventor: Brian D'Andrade, Westhampton, NJ (US)

(73) Assignee: Universal Display Corporation, Ewing, NJ (US)

( * ) Notice: Subject to any disclaimer, the term of this patent is extended or adjusted under 35 U.S.C. 154(b) by 453 days.

(21) Appl. No.: 11/712,923

(22) Filed: Mar. 2, 2007

(65) Prior Publication Data

US 2008/0211390 A1    Sep. 4, 2008

(51) Int. Cl.
H01J 1/62 (2006.01)
(52) U.S. Cl. .................. 313/504; 313/506; 428/690
(58) Field of Classification Search .......... 313/500–512; 257/40; 428/690
See application file for complete search history.

(56) References Cited

U.S. PATENT DOCUMENTS

| | | | |
|---|---|---|---|
| 5,707,745 A | 1/1998 | Forrest et al. | |
| 5,920,080 A * | 7/1999 | Jones | 257/40 |
| 5,932,895 A | 8/1999 | Shen et al. | |
| 5,949,187 A | 9/1999 | Xu et al. | |
| 6,133,692 A | 10/2000 | Xu et al. | |
| 6,232,714 B1 | 5/2001 | Shen et al. | |
| 6,326,224 B1 | 12/2001 | Xu et al. | |
| 6,337,492 B1 | 1/2002 | Jones et al. | |
| 6,548,956 B2 | 4/2003 | Forrest et al. | |
| 6,885,149 B2 | 4/2005 | Parthasarathy et al. | |
| 7,023,013 B2 | 4/2006 | Ricks et al. | |
| 2004/0263441 A1 | 12/2004 | Tanaka et al. | |
| 2005/0249972 A1* | 11/2005 | Hatwar et al. | 428/690 |

2006/0006792 A1    1/2006    Strip

FOREIGN PATENT DOCUMENTS

| | | |
|---|---|---|
| EP | 1 154 676 A1 | 11/2001 |
| EP | 1 450 419 A2 | 8/2004 |
| EP | 1 513 205 | 3/2005 |
| EP | 1 555 855 | 7/2005 |
| WO | WO 01/06816 | 1/2001 |
| WO | WO 2006/083413 | 8/2006 |

OTHER PUBLICATIONS

J. Chan et al., "Cavity design and optimization for organic microcavity OLEDs," Proc. Of SPIE, 2006, vol. 6038.
Ting-Yi Cho et al., "Microcavity two-unit tandem organic light-emitting devices having a high efficiency," Appl. Phys. Lett., Mar. 14, 2006, vol. 88, No. 11106.
Aleksandra B. Djurisic et al., "Organic microcavity light-emitting diodes with metal mirrors: dependence of the emission wavelength on the viewing angle," Appl. Optics, Dec. 20, 2002, vol. 41, No. 36, pp. 7650-7656.
A. Dodabalapur et al., "Microcavity effects in semiconductors," Appl. Phys. Lett., May 9, 1994, vol. 64, No. 19, pp. 2486-2488.

(Continued)

Primary Examiner—Nimeshkumar D. Patel
Assistant Examiner—Mary Bowman
(74) Attorney, Agent, or Firm—Kenyon & Kenyon LLP (57) ABSTRACT

A device is provided that includes an organic emissive layer and a microcavity vertically stacked with the emissive layer, where the emissive layer is not in a microcavity. The microcavity may allow for improved saturation and intensity of emitted light at a variety of viewing angles.

22 Claims, 6 Drawing Sheets

OTHER PUBLICATIONS

A. Dodabalapur et al., "Physics and applications of organic microcavity light emitting diodes," J. Appl. Phys., Dec. 15, 1996, vol. 80, No. 12, pp. 6954-6964.

Sijin Han, "Color tunable metal-cavity organic light-emitting diodes with fullerene layer," J. Appl. Phys., Apr. 20, 2005, vol. 97, No. 093102.

R.H. Jordan et al., "Efficiency enhancement of microcavity organic light emitting diodes," Appl. Phys. Lett., Sep. 30, 1996, vol. 69, No. 14, pp. 1997-1999.

X. Liu et al., "Microcavity organic light emitting diodes wwith double sided light emission of different colors," J. Vac. Sci. Tech. A, May 11, 2004, vol. 22, No. 3, pp. 764-767.

L.J. Rothberg et al., "Resonant cavity organic electroluminescent devices," 1994, IEEE IEDM 94, pp. 571-573.

Takahiro Shiga et al., "Design of multiwavelength resonant cavities for white organic light-emitting diodes," J. App. Phys., Jan. 1, 2003, vol. 93, No. 1, pp. 19-22.

Shizuo Tokito, "Microcavity organic light-emitting diodes for strongly directed pure red, green, and blue emissions," J. Appl. Phys., Sep. 1, 1999, vol. 86, No. 5, pp. 2407-2411.

PCT International Search Report and Written Opinion for PCT/US2008/001744 mailed on Jul. 4, 2008.

Adawi et al., 2006, "Improving the Light extraction efficiency of red-emitting conjugated polymer light emitting diodes", J. Of Appl. Phys. 99:54505-1-54505-8.

* cited by examiner

Device 1
    CIE versus viewing-angle
410 ——— 10° (0.16, 0.22)
420 – – – 20° (0.16, 0.22)
430 · · · · 30° (0.16, 0.22)
440 —·—· 40° (0.16, 0.22)
450 —··— 50° (0.17, 0.23)
460 ········ 60° (0.17, 0.25)

ORGANIC LIGHT EMITTING DEVICE HAVING AN EXTERNAL MICROCAVITY

FIELD OF THE INVENTION

The present invention relates to organic light emitting devices (OLEDs), and more specifically to OLEDs having a microcavity external to an emissive layer.

RESEARCH AGREEMENT

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules. In general, a small molecule has a well-defined chemical formula with a single molecular weight, whereas a polymer has a chemical formula and a molecular weight that may vary from molecule to molecule. As used herein, "organic" includes metal complexes of hydrocarbyl and heteroatom-substituted hydrocarbyl ligands.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

OLED devices are generally (but not always) intended to emit light through at least one of the electrodes, and one or more transparent electrodes may be useful in an organic opto-electronic devices. For example, a transparent electrode material, such as indium tin oxide (ITO), may be used as the bottom electrode. A transparent top electrode, such as disclosed in U.S. Pat. Nos. 5,703,436 and 5,707,745, which are incorporated by reference in their entireties, may also be used. For a device intended to emit light only through the bottom electrode, the top electrode does not need to be transparent, and may be comprised of a thick and reflective metal layer having a high electrical conductivity. Similarly, for a device intended to emit light only through the top electrode, the bottom electrode may be opaque and/or reflective. Where an electrode does not need to be transparent, using a thicker layer may provide better conductivity, and using a reflective electrode may increase the amount of light emitted through the other electrode, by reflecting light back towards the transparent electrode. Fully transparent devices may also be fabricated, where both electrodes are transparent. Side emitting OLEDs may also be fabricated, and one or both electrodes may be opaque or reflective in such devices.

As used herein, "top" means furthest away from the substrate, while "bottom" means closest to the substrate. For example, for a device having two electrodes, the bottom electrode is the electrode closest to the substrate, and is generally the first electrode fabricated. The bottom electrode has two surfaces, a bottom surface closest to the substrate, and a top surface further away from the substrate. Where a first layer is described as "disposed over" a second layer, the first layer is disposed further away from substrate. There may be other layers between the first and second layer, unless it is specified that the first layer is "in physical contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

In some OLEDs, an emissive layer is placed within a microcavity to provide saturated emission. For example, an emissive layer that emits primarily red light may be placed in a microcavity tuned for red light to produce an emission spectrum with saturated red. However, this effect is non-Lambertian, meaning that viewers not directly in front of such a device may observe a color shift and decrease in intensity compared to a viewer directly in front of the device.

SUMMARY OF THE INVENTION

A device is provided that includes an organic emissive layer and a microcavity vertically stacked with the emissive layer, where the emissive layer is not in a microcavity. The microcavity may allow for improved saturation and intensity of emitted light at a variety of viewing angles.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 1, 4-6 (1999) ("Baldo-II"), which are incorporated by reference in their entireties. Phosphorescence may be referred to as a "forbidden" transition because the transition requires a change in spin states, and quantum mechanics indicates that such a transition is not favored. As a result, phosphorescence generally occurs in a time frame exceeding at least 10 nanoseconds, and typically greater than 100 nanoseconds. If the natural radiative lifetime of phosphorescence is too long, triplets may decay by a non-radiative mechanism, such that no light is emitted. Organic phosphorescence is also often observed in molecules containing heteroatoms with unshared pairs of electrons at very low temperatures. 2,2'-bipyridine is such a molecule. Non-radiative decay mechanisms are typically temperature dependent, such that an organic material that exhibits phosphorescence at liquid nitrogen temperatures typically does not exhibit phosphorescence at room temperature. But, as demonstrated by Baldo, this problem may be addressed by selecting phosphorescent compounds that do phosphoresce at room temperature. Representative emissive layers include doped or un-doped phosphorescent organometallic materials such as disclosed in U.S. Pat. Nos. 6,303,238 and 6,310,360; U.S. Patent Application Publication Nos. 2002-0034656; 2002-0182441; 2003-0072964; and WO-02/074015.

Generally, the excitons in an OLED are believed to be created in a ratio of about 3:1, i.e., approximately 75% triplets and 25% singlets. See, Adachi et al., "Nearly 100% Internal Phosphorescent Efficiency In An Organic Light. Emitting Device," J. Appl. Phys., 90, 5048 (2001), which is incorporated by reference in its entirety. In many cases, singlet excitons may readily transfer their energy to triplet excited states via "intersystem crossing," whereas triplet excitons may not readily transfer their energy to singlet excited states. As a result, 100% internal quantum efficiency is theoretically possible with phosphorescent OLEDs. In a fluorescent device, the energy of triplet excitons is generally lost to radiationless decay processes that heat-up the device, resulting in much lower internal quantum efficiencies. OLEDs utilizing phosphorescent materials that emit from triplet excited states are disclosed, for example, in U.S. Pat. No. 6,303,238, which is incorporated by reference in its entirety.

Phosphorescence may be preceded by a transition from a triplet excited state to an intermediate non-triplet state from which the emissive decay occurs. For example, organic molecules coordinated to lanthanide elements often phosphoresce from excited states localized on the lanthanide metal. However, such materials do not phosphoresce directly from a triplet excited state but instead emit from an atomic excited state centered on the lanthanide metal ion. The europium diketonate complexes illustrate one group of these types of species.

Phosphorescence from triplets can be enhanced over fluorescence by confining, preferably through bonding, the organic molecule in close proximity to an atom of high atomic number. This phenomenon, called the heavy atom effect, is created by a mechanism known as spin-orbit coupling. Such a phosphorescent transition may be observed from an excited metal-to-ligand charge transfer (MLCT) state of an organometallic molecule such as tris(2-phenylpyridine)iridium(III).

As used herein, the term "triplet energy" refers to an energy corresponding to the highest energy feature discernable in the phosphorescence spectrum of a given material. The highest energy feature is not necessarily the peak having the greatest intensity in the phosphorescence spectrum, and could, for example, be a local maximum of a clear shoulder on the high energy side of such a peak.

The term "organometallic" as used herein is as generally understood by one of ordinary skill in the art and as given, for example, in "Inorganic Chemistry" (2nd Edition) by Gary L. Miessler and Donald A. Tarr, Prentice Hall (1998). Thus, the term organometallic refers to compounds which have an organic group bonded to a metal through a carbon-metal bond. This class does not include per se coordination compounds, which are substances having only donor bonds from heteroatoms, such as metal complexes of amines, halides, pseudohalides (CN, etc.), and the like. In practice organometallic compounds generally comprise, in addition to one or more carbon-metal bonds to an organic species, one or more donor bonds from a heteroatom. The carbon-metal bond to an organic species refers to a direct bond between a metal and a carbon atom of an organic group, such as phenyl, alkyl, alkenyl, etc., but does not refer to a metal bond to an "inorganic carbon," such as the carbon of CN or CO.

Figure 1:
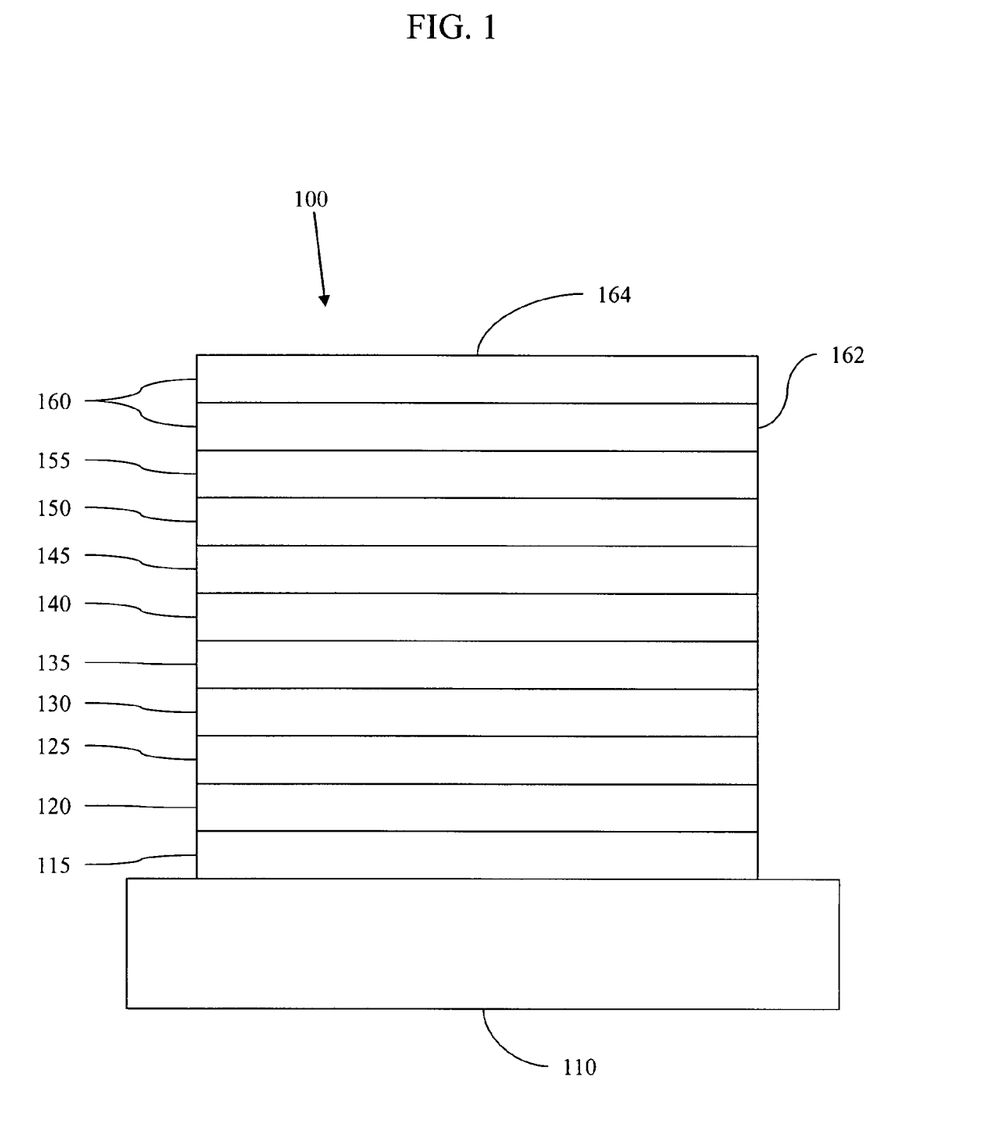
FIG. 1 shows an organic light emitting device having separate electron transport, hole transport, and emissive layers, as well as other layers.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order.

Substrate 110 may be any suitable substrate that provides desired structural properties. Substrate 110 may be flexible or rigid. Substrate 110 may be transparent, translucent or opaque. Plastic and glass are examples of preferred rigid substrate materials. Plastic and metal foils are examples of preferred flexible substrate materials. Substrate 110 may be a semiconductor material in order to facilitate the fabrication of circuitry. For example, substrate 110 may be a silicon wafer upon which circuits are fabricated, capable of controlling OLEDs subsequently deposited on the substrate. Other substrates may be used. The material and thickness of substrate 110 may be chosen to obtain desired structural and optical properties.

Anode 115 may be any suitable anode that is sufficiently conductive to transport holes to the organic layers. The material of anode 115 preferably has a work function higher than about 4 eV (a "high work function material"). Preferred anode materials include conductive metal oxides, such as indium tin oxide (ITO) and indium zinc oxide (IZO), aluminum zinc oxide (AlZnO), and metals. Anode 115 (and substrate 110) may be sufficiently transparent to create a bottom-emitting device. A preferred transparent substrate and anode combination is commercially available ITO (anode) deposited on glass or plastic (substrate). A flexible and transparent substrate-anode combination is disclosed in U.S. Pat. Nos. 5,844,363 and 6,602,540 B2, which are incorporated by reference in their entireties. Anode 115 may be opaque and/or reflective. A reflective anode 115 may be preferred for some top-emitting devices, to increase the amount of light emitted from the top of the device. The material and thickness of anode 115 may be chosen to obtain desired conductive and optical properties. Where anode 115 is transparent, there may be a range of thickness for a particular material that is thick enough to provide the desired conductivity, yet thin enough to provide the desired degree of transparency. Other anode materials and structures may be used.

Hole transport layer 125 may include a material capable of transporting holes. Hole transport layer 130 may be intrinsic (undoped), or doped. Doping may be used to enhance conductivity. α-NPD and TPD are examples of intrinsic hole transport layers. An example of a p-doped hole transport layer is m-MTDATA doped with $F_4$-TCNQ at a molar ratio of 50:1, as disclosed in United States Patent Application Publication No. 2003-0230980 to Forrest et al., which is incorporated by reference in its entirety. Other hole transport layers may be used.

Emissive layer 135 may include an organic material capable of emitting light when a current is passed between anode 115 and cathode 160. Preferably, emissive layer 135 contains a phosphorescent emissive material, although fluorescent emissive materials may also be used. Phosphorescent materials are preferred because of the higher luminescent efficiencies associated with such materials. Emissive layer 135 may also comprise a host material capable of transporting electrons and/or holes, doped with an emissive material that may trap electrons, holes, and/or excitons, such that excitons relax from the emissive material via a photoemissive mechanism. Emissive layer 135 may comprise a single material that combines transport and emissive properties. Whether the emissive material is a dopant or a major constituent, emissive layer 135 may comprise other materials, such as dopants that tune the emission of the emissive material. Emissive layer 135 may include a plurality of emissive materials capable of, in combination, emitting a desired spectrum of light. Examples of phosphorescent emissive materials include $Ir(ppy)_3$. Examples of fluorescent emissive materials include DCM and DMQA. Examples of host materials include $Alq_3$, CBP and mCP. Examples of emissive and host materials are disclosed in U.S. Pat. No. 6,303,238 to Thompson et al., which is incorporated by reference in its entirety. Emissive material may be included in emissive layer 135 in a number of ways. For example, an emissive small molecule may be incorporated into a polymer. This may be accomplished by several ways: by doping the small molecule into the polymer either as a separate and distinct molecular species; or by incorporating the small molecule into the backbone of the polymer, so as to form a co-polymer; or by bonding the small molecule as a pendant group on the polymer. Other emissive layer materials and structures may be used. For example, a small molecule emissive material may be present as the core of a dendrimer.

Many useful emissive materials include one or more ligands bound to a metal center. A ligand may be referred to as "photoactive" if it contributes directly to the photoactive properties of an organometallic emissive material. A "photoactive" ligand may provide, in conjunction with a metal, the energy levels from which and to which an electron moves when a photon is emitted. Other ligands may be referred to as "ancillary." Ancillary ligands may modify the photoactive properties of the molecule, for example by shifting the energy levels of a photoactive ligand, but ancillary ligands do not directly provide the energy levels involved in light emission. A ligand that is photoactive in one molecule may be ancillary in another. These definitions of photoactive and ancillary are intended as non-limiting theories.

Electron transport layer 145 may include a material capable of transporting electrons. Electron transport layer 145 may be intrinsic (undoped), or doped. Doping may be used to enhance conductivity. $Alq_3$ is an example of an intrinsic electron transport layer. An example of an n-doped electron transport layer is BPhen doped with Li at a molar ratio of 1:1, as disclosed in United States Patent Application Publication No. 2003-02309890 to Forrest et al., which is incorporated by reference in its entirety. Other electron transport layers may be used.

The charge carrying component of the electron transport layer may be selected such that electrons can be efficiently injected from the cathode into the LUMO (Lowest Unoccupied Molecular Orbital) energy level of the electron transport layer. The "charge carrying component" is the material responsible for the LUMO energy level that actually transports electrons. This component may be the base material, or it may be a dopant. The LUMO energy level of an organic material may be generally characterized by the electron affinity of that material and the relative electron injection efficiency of a cathode may be generally characterized in terms of the work function of the cathode material. This means that the preferred properties of an electron transport layer and the adjacent cathode may be specified in terms of the electron affinity of the charge carrying component of the ETL and the work function of the cathode material. In particular, so as to achieve high electron injection efficiency, the work function of the cathode material is preferably not greater than the electron affinity of the charge carrying component of the electron transport layer by more than about 0.75 eV, more preferably, by not more than about 0.5 eV. Similar considerations apply to any layer into which electrons are being injected.

Cathode 160 may be any suitable material or combination of materials known to the art, such that cathode 160 is capable of conducting electrons and injecting them into the organic layers of device 100. Cathode 160 may be transparent or opaque, and may be reflective. Metals and metal oxides are examples of suitable cathode materials. Cathode 160 may be a single layer, or may have a compound structure. FIG. 1 shows a compound cathode 160 having a thin metal layer 162 and a thicker conductive metal oxide layer 164. In a compound cathode, preferred materials for the thicker layer 164 include ITO, IZO, and other materials known to the art. U.S. Pat. Nos. 5,703,436, 5,707,745, 6,548,956 B2 and 6,576,134 B2, which are incorporated by reference in their entireties, disclose examples of cathodes including compound cathodes having a thin layer of metal such as Mg:Ag with an overlying transparent, electrically-conductive, sputter-deposited ITO layer. The part of cathode 160 that is in contact with the underlying organic layer, whether it is a single layer cathode 160, the thin metal layer 162 of a compound cathode, or some other part, is preferably made of a material having a work function lower than about 4 eV (a "low work function material"). Other cathode materials and structures may be used.

Blocking layers may be used to reduce the number of charge carriers (electrons or holes) and/or excitons that leave the emissive layer. An electron blocking layer 130 may be disposed between emissive layer 135 and the hole transport layer 125, to block electrons from leaving emissive layer 135 in the direction of hole transport layer 125. Similarly, a hole blocking layer 140 may be disposed between emissive layer 135 and electron transport layer 145, to block holes from leaving emissive layer 135 in the direction of electron transport layer 145. Blocking layers may also be used to block excitons from diffusing out of the emissive layer. The theory and use of blocking layers is described in more detail in U.S. Pat. No. 6,097,147 and United States Patent Application Publication No. 2003-02309890 to Forrest et al., which are incorporated by reference in their entireties.

As used herein, and as would be understood by one skilled in the art, the term "blocking layer" means that the layer provides a barrier that significantly inhibits transport of charge carriers and/or excitons through the device, without suggesting that the layer necessarily completely blocks the charge carriers and/or excitons. The presence of such a blocking layer in a device may result in substantially higher efficiencies as compared to a similar device lacking a blocking layer. Also, a blocking layer may be used to confine emission to a desired region of an OLED.

Generally, injection layers are comprised of a material that may improve the injection of charge carriers from one layer, such as an electrode or an organic layer, into an adjacent organic layer. Injection layers may also perform a charge transport function. In device 100, hole injection layer 120 may be any layer that improves the injection of holes from anode 115 into hole transport layer 125. CuPc is an example of a material that may be used as a hole injection layer from an ITO anode 115, and other anodes. In device 100, electron injection layer 150 may be any layer that improves the injection of electrons into electron transport layer 145. LiF/Al is an example of a material that may be used as an electron injection layer into an electron transport layer from an adjacent layer. Other materials or combinations of materials may be used for injection layers. Depending upon the configuration of a particular device, injection layers may be disposed at locations different than those shown in device 100. More examples of injection layers are provided in U.S. patent application Ser. No. 09/931,948 to Lu et al., which is incorporated by reference in its entirety. A hole injection layer may comprise a solution deposited material, such as a spin-coated polymer, e.g., PEDOT:PSS, or it may be a vapor deposited small molecule material, e.g., CuPc or MTDATA.

A hole injection layer (HIL) may planarize or wet the anode surface so as to provide efficient hole injection from the anode into the hole injecting material. A hole injection layer may also have a charge carrying component having HOMO (Highest Occupied Molecular Orbital) energy levels that favorably match up, as defined by their herein-described relative ionization potential (IP) energies, with the adjacent anode layer on one side of the HIL and the hole transporting layer on the opposite side of the HIL. The "charge carrying component" is the material responsible for the HOMO energy level that actually transports holes. This component may be the base material of the HIL, or it may be a dopant. Using a doped HIL allows the dopant to be selected for its electrical properties, and the host to be selected for morphological properties such as wetting, flexibility, toughness, etc. Preferred properties for the HIL material are such that holes can be efficiently injected from the anode into the HIL material. In particular, the charge carrying component of the HIL preferably has an IP not more than about 0.7 eV greater that the IP of the anode material. More preferably, the charge carrying component has an IP not more than about 0.5 eV greater than the anode material. Similar considerations apply to any layer into which holes are being injected. HIL materials are further distinguished from conventional hole transporting materials that are typically used in the hole transporting layer of an OLED in that such HIL materials may have a hole conductivity that is substantially less than the hole conductivity of conventional hole transporting materials. The thickness of the HIL of the present invention may be thick enough to help planarize or wet the surface of the anode layer. For example, an HIL thickness of as little as 10 nm may be acceptable for a very smooth anode surface. However, since anode surfaces tend to be very rough, a thickness for the HIL of up to 50 nm may be desired in some cases.

A protective layer may be used to protect underlying layers during subsequent fabrication processes. For example, the processes used to fabricate metal or metal oxide top electrodes may damage organic layers, and a protective layer may be used to reduce or eliminate such damage. In device 100, protective layer 155 may reduce damage to underlying organic layers during the fabrication of cathode 160. Preferably, a protective layer has a high carrier mobility for the type of carrier that it transports (electrons in device 100), such that it does not significantly increase the operating voltage of device 100. CuPc, BCP, and various metal phthalocyanines are examples of materials that may be used in protective layers. Other materials or combinations of materials may be used. The thickness of protective layer 155 is preferably thick enough that there is little or no damage to underlying layers due to fabrication processes that occur after organic protective layer 160 is deposited, yet not so thick as to significantly increase the operating voltage of device 100. Protective layer 155 may be doped to increase its conductivity. For example, a CuPc or BCP protective layer 160 may be doped with Li. A more detailed description of protective layers may be found in U.S. patent application Ser. No. 09/931,948 to Lu et al., which is incorporated by reference in its entirety.

Figure 2:
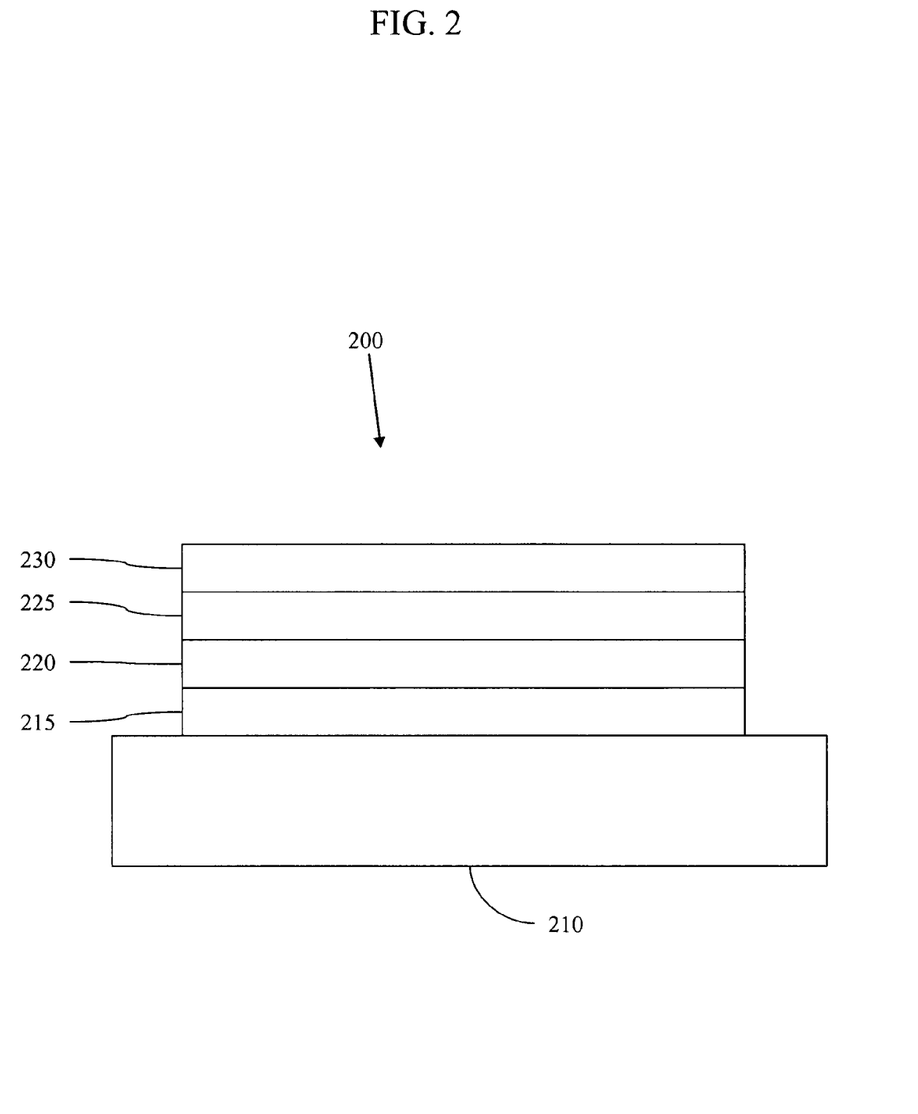
FIG. 2 shows an inverted organic light emitting device that does not have a separate electron transport layer.

FIG. 2 shows an inverted OLED 200. The device includes a substrate 210, an cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190, Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJP. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

The molecules disclosed herein may be substituted in a number of different ways without departing from the scope of the invention. For example, substituents may be added to a compound having three bidentate ligands, such that after the substituents are added, one or more of the bidentate ligands are linked together to form, for example, a tetradentate or hexadentate ligand. Other such linkages may be formed. It is believed that this type of linking may increase stability relative to a similar compound without linking, due to what is generally understood in the art as a "chelating effect."

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

OLEDs may be constructed such that electrodes or other reflective or semi-reflective layers of the device define a microcavity. When the optical distance between two reflective or semi-reflective layers has a magnitude that is comparable to a wavelength of visible light, microcavity effects may result. The transmission of the separated layers may then exceed the transmission of the individual reflective or semi-reflective layers at one or more wavelengths or wavelength ranges. For example, a device may quench, prevent, or otherwise diminish emission at some wavelengths, and/or increase emission at certain wavelengths at which the device emits. While these and similar effects may be referred to as "microcavity effects," these devices are not necessarily considered to contain or define a "microcavity" as used herein. Such incidental microcavity effects typically are unintentional and undesirable.

A microcavity may be characterized by its finesse. The finesse F of a microcavity is defined as the ratio of the separation between resonant peaks in the transmission spectrum of the microcavity, $\Delta \upsilon$, to the full-width at half-maximum (FWHM) of the resonant frequency peak of the spectrum, $\Delta\upsilon_{1/2}$: $F=\Delta\upsilon/\Delta\upsilon_{1/2}$. As used herein, a "microcavity" is a stack of two or more layers having a finesse greater than about 1.5; the two outer layers of a microcavity may be referred to as "defining" a microcavity when the resulting microcavity has a finesse of at least about 1.5. Such a finesse corresponds to microcavity effects that are stronger than the incidental effects typically observed in, for example, an OLED. Incidental microcavity effects in an OLED generally have a finesse of less than 1.5, often less than 0.5. It may be preferred for microcavities used in conjunction with the present invention to have a finesse of at least about 5, which corresponds to a spectrum having, for example, a FWHM of 60 nm and resonant peak separation of 300 nm. Microcavities with a finesse of up to 100 may be used.

The resonant peaks in the transmission spectrum of a microcavity can be controlled by adjusting the reflectivity of the layers defining the microcavity and the separation between the layers. In general, microcavities may be constructed that have one transparent or semitransparent reflective layer and one opaque reflective layer. It may be preferred for reflective layers used in the microcavity devices described herein to have a reflectance of at least 20%, and more preferably 30-100%. In some cases, the "opaque" reflective layer may be opaque only with respect to certain wavelengths of visible light, while allowing other wavelengths to pass through the layer. In such a configuration, it may be preferred for the reflective layer to be at least 20% reflective, and more preferably 30-100% reflective, with respect to the desired wavelengths. The emission in the forward direction (i.e., through the transparent or semitransparent reflective layer) may be calculated as:

$$|E_c(\lambda)|^2 = \frac{(1-R_d)\left[1+R_m+2\sqrt{R_m}\cos\left(\frac{4\pi x}{\lambda}\right)\right]}{1+\sqrt{R_m R_d}\cos\left(\frac{4\pi L}{\lambda}\right)}|E_n(\lambda)|^2 \quad (\text{Eq. 1})$$

where $\lambda$ is the emission wavelength, x is the effective distance of the emissive layer from the opaque layer, $R_m$ and $R_d$ are the reflectivities of the opaque mirror and the transparent mirror, respectively, L is the total optical length of the microcavity, and $E_n(\lambda)$ is an original (free-space) spectrum. The optical length of the microcavity, L, may be given by:

$$L = \frac{\lambda}{2}\left(\frac{n_{\mathit{eff}}}{\Delta n}\right) + \sum_i n_i d_i + \left|\frac{\varphi_m}{4\pi}\lambda\right| \quad (\text{Eq. 2})$$

where $n_{\mathit{eff}}$ and $\Delta n$ are the effective refractive index and the index difference between the reflective layers, $n_i$ and $d_i$ are the refractive index and the thickness of the organic layers and the transparent layer, and $\phi_m$ is the phase change at the opaque mirror. Thus, a microcavity may be used to enhance emission at certain wavelength, wavelengths, or range of wavelengths, while inhibiting emission at others. As used herein, the microcavity may be said to "leak" those wavelengths of light which are quenched, left unchanged, and/or only minimally enhanced by the microcavity.

Figure 3:
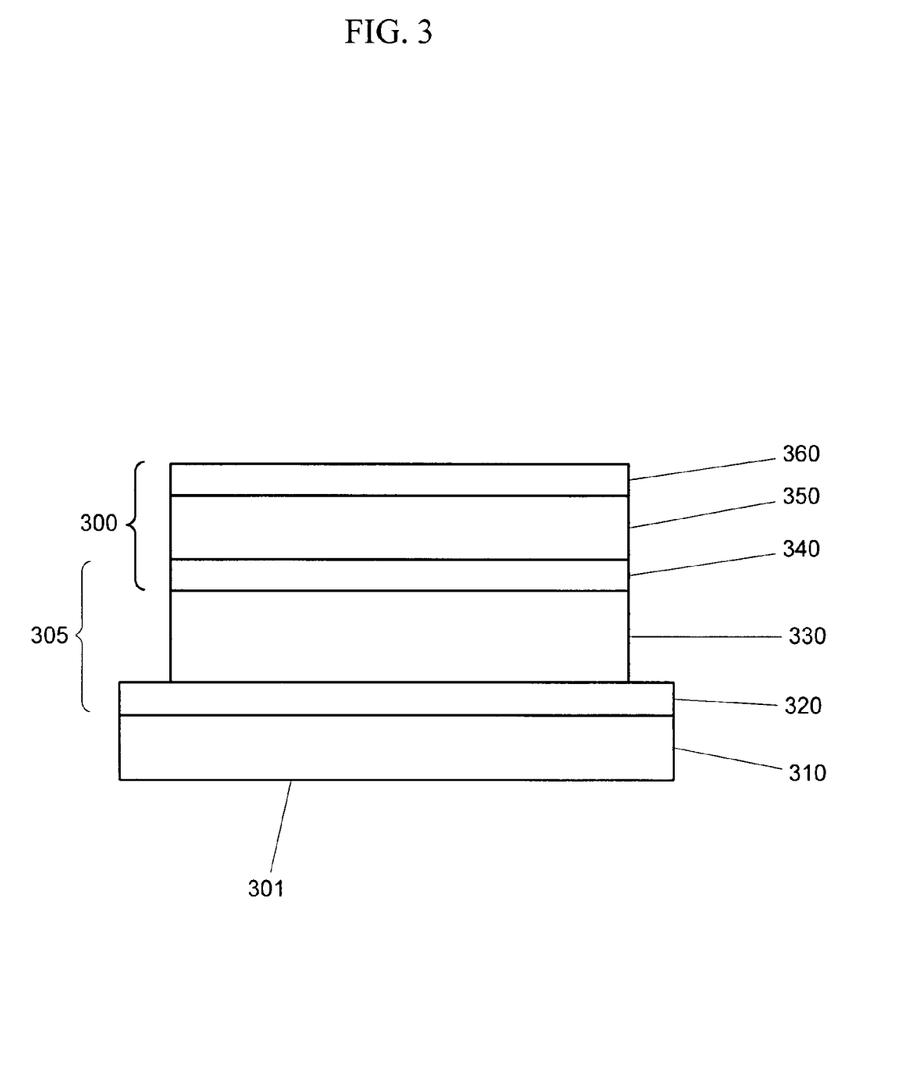
FIG. 3 shows a device having an emissive layer vertically stacked with a microcavity.

FIG. 3 shows a device having a substrate 310, a transparent conductive layer 320, an organic emissive layer 330, and a microcavity 300. The microcavity may include a reflective layer 340, spacing layer 350, and a reflective layer 360. It will be understood that the separate layers illustrated in FIG. 3 are provided by way of example, and that some layers may be combined and/or omitted, and other layers may be present in the device. For example, the reflective layer 340 may also be an electrode for causing emission by the emissive layer 330. Similarly, a separate transparent conductive layer 320 may be omitted, such as where a pre-coated substrate 310 is used. Other layers commonly used in OLEDs, such as transport layers, blocking layers, multiple emissive layers, and other layers as previously described may also be disposed between the layers 320, 340. In general, layers 320, 330, and 340 may be referred to as an OLED 305, although one layer 340 may be "shared" with the vertically-stacked microcavity 300. In other configurations, the single layer 340 may be replaced by separate layers used for the top layer of the OLED 305 and the bottom layer of the microcavity 300. The microcavity 300 may be referred to as an "external" microcavity, since it is disposed external to the OLED 305 and/or emissive layer 330.

The microcavity 300 is a non-emissive microcavity. That is, in contrast to the organic emissive layer 330, the spacing layer 350 does not emit light when a voltage is applied to the device. A voltage may be applied across the layers 320 and 340 on either side of the emissive layer, although in some configurations a voltage may be applied across the entire device. The emissive layer 330 and OLED 305 are not configured as a microcavity; that is, the spacing and reflectivity of the layers in the OLED do not define a microcavity. However, in some cases, OLEDs such as OLED 305 may be described as having microcavity effects as previously described, though such effects are generally considered undesirable.

The microcavity 300 may transmit and/or reflect certain wavelengths of light emitted by the emissive layer 330. In general, the emissive layer 330 can emit light in any direction. When the emissive layer emits light, some light may enter the microcavity 300. As previously described, the microcavity may admit wavelengths of light that are at or near the resonance wavelength of the microcavity, while leaking other wavelengths. By adjusting the separation and reflectivity of the reflective layers 340, 360, the specific wavelengths leaked by the microcavity may be selected. In general, the microcavity may be adjusted to leak wavelengths not in the region of the color of light the device is intended to emit. Preferably, the microcavity has one or more resonant wavelengths within 0 nm-60 nm of the color to be emitted by the device. That is, it is preferred that the emissive layer emit light within 0 nm-60 nm of a resonant wavelength or wavelengths of the microcavity.

Wavelengths not leaked by the microcavity may be reflected by the reflective layer 360 and emitted through the substrate 310. In some configurations, the reflective layer 360 may be partially reflective, or it may be reflective only with respect to certain wavelengths of light. This may allow some light to be emitted in the direction opposite the emissive layer (i.e., from the "top" of the device shown in FIG. 3). The reflective layer 360 is preferably most reflective to the color of light the device is to emit. For example, if a red emitting device is desired, the reflective layer may be selected to reflect light in the red region of the spectrum. It may be preferred for the reflective layer 360 to reflect all light in a desired wavelength range, and for the microcavity 300 to leak other wavelengths. For example, in a red-emitting device it may be desirable for the microcavity to leak green and blue light.

As a specific example, if a blue-emitting device is desired, it may be desirable for the microcavity to leak visible wavelengths longer than 500 nm. More preferably, the microcavity can leak 20-100% of light having a wavelength of 500 nm-700 nm. Similarly, for a green device it is preferable for the microcavity to leak wavelengths longer than about 560 nm and shorter than about 500 nm, and more preferably, 20-100% of light at wavelengths of 560 nm-700 nm and 400-500 nm. For a red device, the microcavity preferably leaks wavelengths shorter than about 600 nm, and more preferably 20-100% of light having a wavelength of 400 nm-600 nm.

It has been found that using a non-emissive microcavity disposed external to the emissive layer, as described herein, can allow for saturated emission without incurring the severe viewing angle dependence common to other devices utilizing an emissive layer disposed in a microcavity. Specifically, the saturated microcavity-type emission may be observed at viewing angles of up to 50-60° measured from the normal. Similarly, the color shift generally expected from microcavity emission may be reduced. It has been found that at a viewing angle of 60°, the CIE of emitted light varies by the light emitted in the forward direction (i.e., 0° from the normal) by as little as (0.01, 0.01)-(0.05, 0.05). In contrast, a standard emissive layer disposed in a standard microcavity may exhibit non-Lambertian effects or substantial color shifting at viewing angles as low as 10° from the normal. The use of an external microcavity therefore may provide many of the advantages of an emissive microcavity, while reducing undesirable effects typically associated with microcavity emission.

It may be preferred for a device using a microcavity external to an emissive layer to emit light through a surface of the device closer to the emissive layer than to the microcavity, such as the "bottom" surface of the substrate 310 in FIG. 3. In such a configuration, some light emitted by the emissive layer may reflect off the "back" of the device (i.e., the reflective layer 360 in FIG. 3), where it can be enhanced or leaked by the microcavity. As used herein, a "viewing surface" of a device refers to a surface of the device from which light is emitted in the direction of an intended viewer of the device. In some cases, a device may have a single viewing surface, such as surface 301. That is, the device may be structured or enclosed such that little or no light is emitted through surfaces of the device other than the single viewing surface. In such a configuration it may be preferred for the outer reflective layer of the microcavity, such as reflective layer 360 in FIG. 3, to reflect only or primarily a certain range of wavelengths, which can roughly correspond to a color of light to be emitted by the device. Such a configuration may further reduce the non-Lambertian effects typically associated with the use of microcavities, since some of the emitted light—the portion that is initially emitted in the direction away from the microcavity and toward a viewing surface of the device—will be unaffected by the microcavity.

It is understood that the various embodiments described herein are by way of example only, and are not intended to limit the scope of the invention. For example, many of the materials and structures described herein may be substituted with other materials and structures without deviating from the spirit of the invention. It is understood that various theories as to why the invention works are not intended to be limiting. For example, theories relating to charge transfer are not intended to be limiting.

Material Definitions:
As used herein, abbreviations refer to materials as follows:
CBP: 4,4'-N,N-dicarbazole-biphenyl
m-MTDATA: 4,4',4"-tris(3-methylphenylphenylamino)triphenylamine
$Alq_3$: 8-tris-hydroxyquinoline aluminum
Bphen: 4,7-diphenyl-1,10-phenanthroline
n-BPhen: n-doped BPhen (doped with lithium)
$F_4$-TCNQ: tetrafluoro-tetracyano-quinodimethane
p-MTDATA: p-doped m-MTDATA (doped with $F_4$-TCNQ)
$Ir(ppy)_3$: tris(2-phenylpyridine)-iridium
$Ir(ppz)_3$: tris(1-phenylpyrazoloto,N,C(2')iridium(III)
BCP: 2,9-dimethyl-4,7-diphenyl-1,10-phenanthroline
TAZ: 3-phenyl-4-(1'-naphthyl)-5-phenyl-1,2,4-triazole
CuPc: copper phthalocyanine.
ITO: indium tin oxide
NPD: N,N'-diphenyl-N—N'-di(1-naphthyl)-benzidine
TPD: N,N'-diphenyl-N—N'-di(3-toly)-benzidine
BAlq: aluminum(III)bis(2-methyl-8-hydroxyquinolinato)4-phenylphenolate
mCP: 1,3-N,N-dicarbazole-benzene
DCM: 4-(dicyanoethylene)-6-(4-dimethylaminostyryl-2-methyl)-4H-pyran
DMQA: N,N'-dimethylquinacridone
PEDOT:PSS: an aqueous dispersion of poly(3,4-ethylene-dioxythiophene) with polystyrenesulfonate (PSS)
es20: Iridium(III)tris(3-methyl-2-phenylpyridine)

EXPERIMENTAL

Specific representative embodiments of the invention will now be described, including how such embodiments may be made. It is understood that the specific methods, materials, conditions, process parameters, apparatus and the like do not necessarily limit the scope of the invention.

Two devices were fabricated with the following structures:
Device 1: es20 [10 nm]/NPD [30 nm]/mCBP:dopant 9% [30 nm]/Alq [40 nm]/LiF [0.5 nm]/Al [20 nm]/NPD[120 nm]/Al[20 nm]
Device 2: es20 [10 nm]/NPD [30 nm]/mCBP:dopant 9% [30 nm]/Alq [40 nm]/LiF [0.5 nm]/Al [100 nm]

Figure 4:
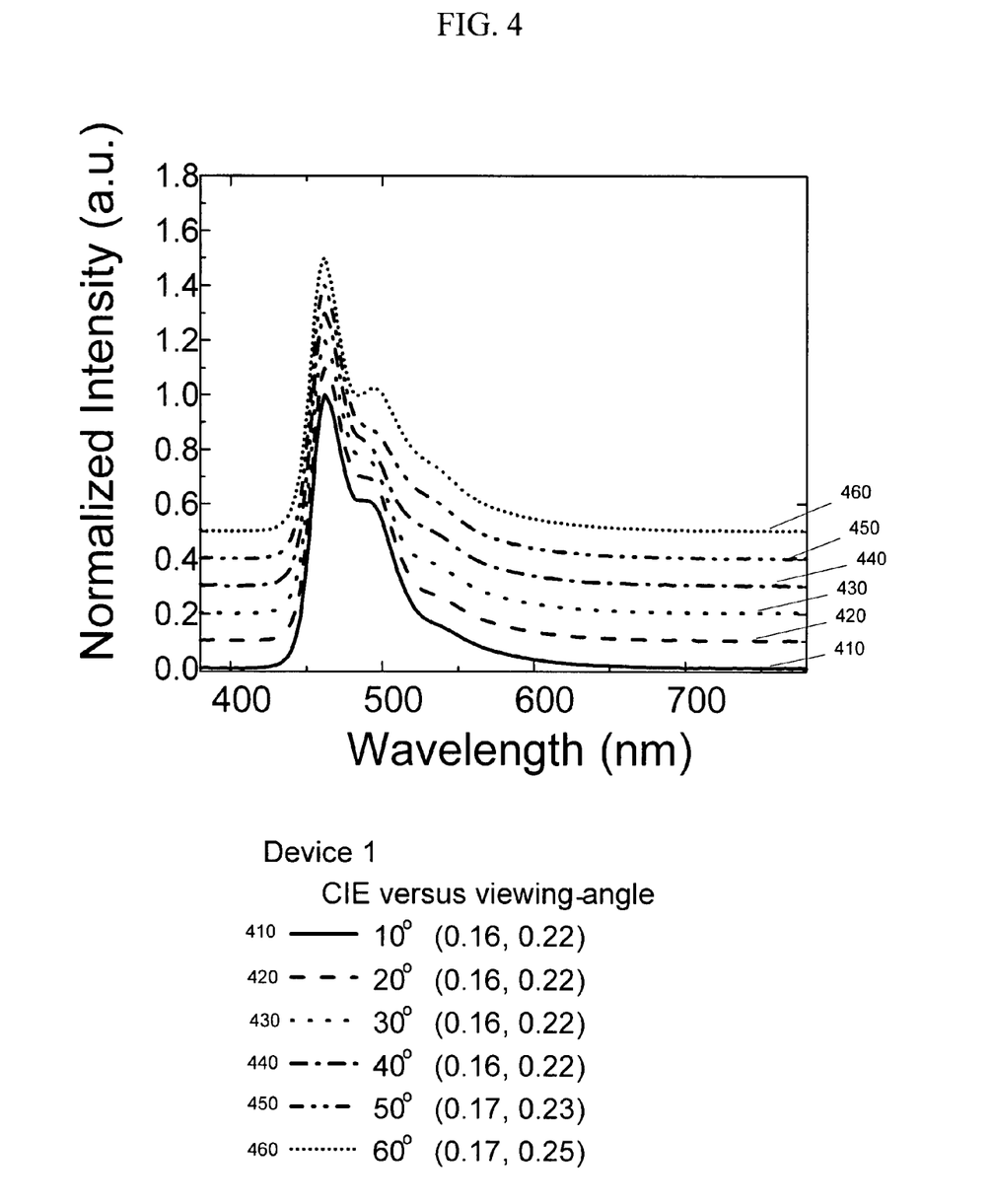
FIG. 4 shows intensity as a function of wavelength for light emitted by a device having an emissive layer vertically stacked with a microcavity.

As shown above, Device 1 included a microcavity defined by the Al/NPD/Al layers. FIG. 4 shows the normalized intensity as a function of wavelength for Device 1 at viewing angles of 10° (410), 20° (420), 30° (430), 40° (440), 50° (450) and 60° (460) and shows the CIE measured from each angle. As illustrated, the CIE showed no change at viewing angles of up to 40°, and at 60° showed a change of only (0.01, 0.03). That is, saturated emission is surprisingly observed at viewing angles up to 60°, whereas for a standard emissive microcavity such emission would be expected to taper off quickly at higher viewing angles.

Figure 5:
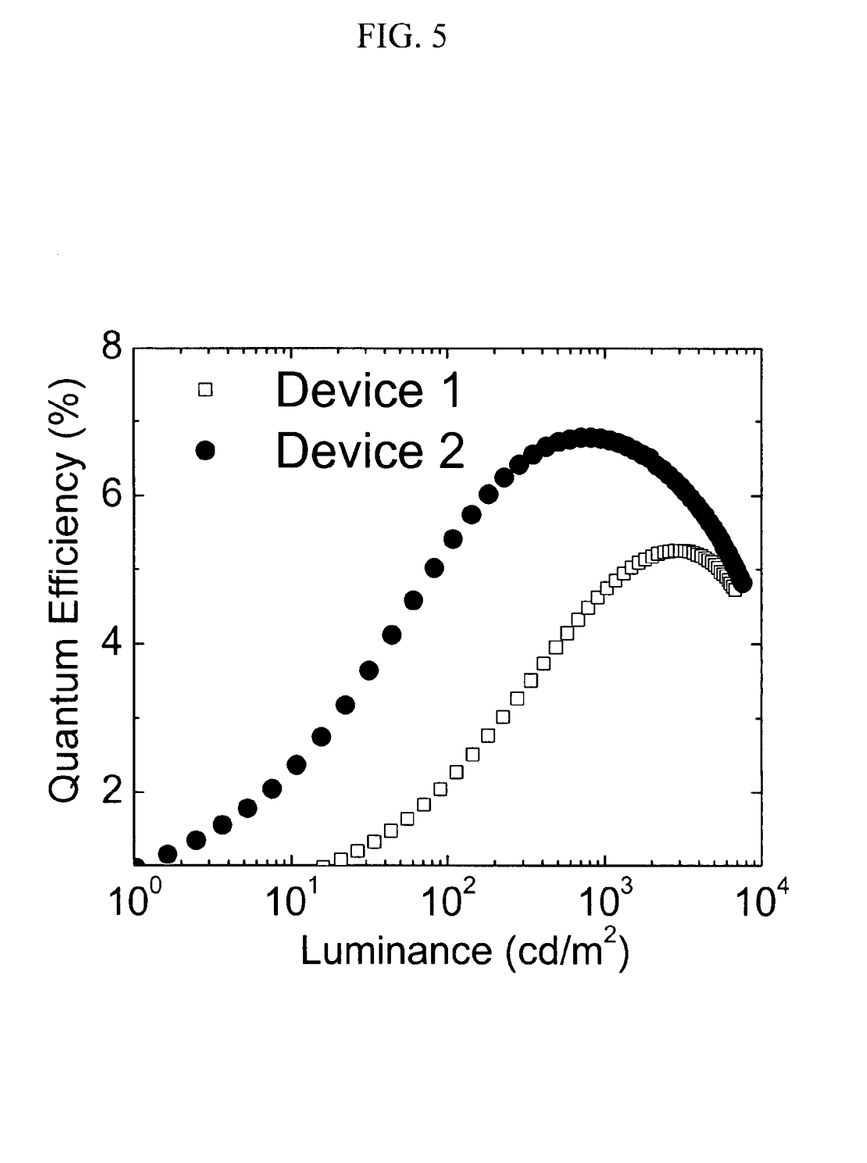
FIG. 5 shows quantum efficiency as a function of luminance for light emitted by a device having an emissive layer vertically stacked with a microcavity.
Figure 6:
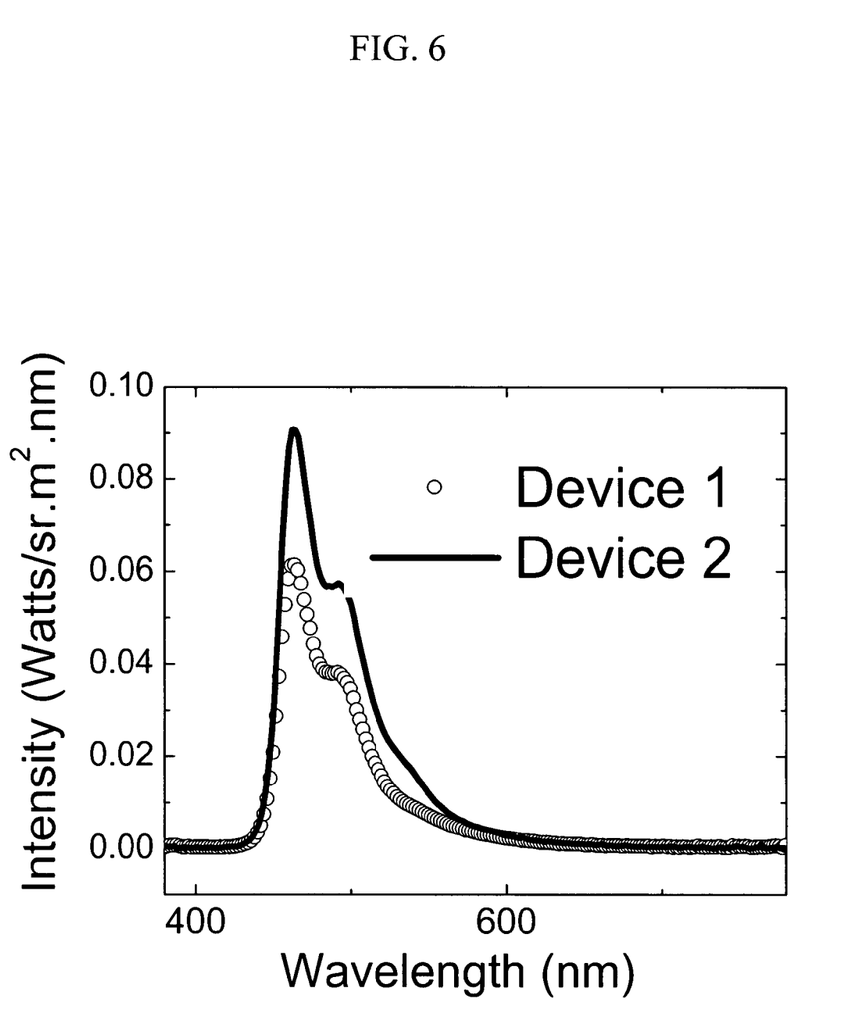
FIG. 6 shows intensity as a function of wavelength for light emitted by a device having an emissive layer vertically stacked with a microcavity.

FIG. 5 shows the quantum efficiency as a function of luminance, and FIG. 6 shows the intensity as a function of wavelength for both devices.

The compound "es20" is described by the same name in U.S. application Ser. No. 11/704,585 to Knowles et al., filed Feb. 9, 2007, entitled"Metal Complexes of Cyclometallated Imidazo[1,2-f]phenanthridine and Diimidazo[1,2-a:1',2'-c]quinazoline Ligands and Isoelectronic and Benzannulated Analogs Thereof," the disclosure of which is incorporated by reference in its entirety.

While the present invention is described with respect to particular examples and preferred embodiments, it is understood that the present invention is not limited to these examples and embodiments. The present invention as claimed therefore includes variations from the particular examples and preferred embodiments described herein, as will be apparent to one of skill in the art.

What is claimed is:
1. A device comprising:
an organic light emitting device comprising an organic emissive layer; and
a non-emissive microcavity having a finesse of 1.5 to 100 vertically stacked with the organic emissive layer,
wherein the organic emissive layer is not disposed within a microcavity; and wherein the CIE of light emitted by the device when measured from a viewing angle of 60° differs from the CIE when measured from a viewing angle of 0° by no more than (0.1, 0.1).

2. The device of claim 1, wherein the device has a viewing surface that is closer to the emissive layer than to the microcavity.

3. The device of claim 2, wherein the device has a single viewing surface and the emissive layer is disposed between the non-emissive microcavity and the viewing surface of the device.

4. The device of claim 1, further comprising a substrate, wherein the organic light emitting device is disposed over the substrate and wherein the device is configured to emit light through a surface of the device closer to the emissive layer than to the microcavity.

5. The device of claim 1, wherein the peak wavelength of light emitted by the organic emissive layer is within 0 nm-60 nm of a resonant wavelength of the microcavity.

6. The device of claim 1, the organic light emitting device further comprising a first electrode and a second electrode, wherein the organic emissive layer is disposed between the first electrode and the second electrode, and wherein the second electrode is a bottom boundary of the microcavity.

7. The device of claim 1, wherein the microcavity has a finesse of 1.5 to 5.

8. The device of claim 1, wherein the microcavity leaks 20-100% of light having a wavelength of 500 nm-700 nm.

9. The device of claim 1, wherein the microcavity leaks 20-100% of light having a wavelength of 560 nm-700 nm and 20-100% of light having a wavelength of 400-500 nm.

10. The device of claim 1, wherein the microcavity leaks 20-100% of light having a wavelength of 400 nm-600 nm.

11. A device comprising:
an organic light emitting device further comprising an organic emissive layer; and
a non-emissive microcavity disposed over the organic emissive layer;
wherein the device is configured to emit light through a surface of the device closer to the emissive layer than to the microcavity,
wherein the microcavity has a finesse of at least about 1.5; and
wherein the CIE of light emitted by the device when measured from a viewing angle of 60° differs from the CIE when measured from a viewing angle of 0° by no more than (0.1, 0.1).

12. The device of claim 11, further comprising a substrate, wherein the organic light emitting device is disposed over the substrate.

13. The device of claim 12, wherein the surface of the substrate parallel to and farthest from the organic light emitting device is a viewing surface of the device.

14. The device of claim 11, wherein the device has a single viewing surface and the emissive layer is disposed between the non-emissive microcavity and the viewing surface of the device.

15. The device of claim 11, the organic light emitting device further comprising a first electrode and a second electrode, wherein the organic emissive layer is disposed between the first electrode and the second electrode, and wherein the second electrode is a bottom boundary of the microcavity.

16. The device of claim 11, wherein the microcavity has a finesse of 1.5 to 5.

17. The device of claim 1, wherein the CIE of light emitted by the device when measured from a viewing angle of 60° differs from the CIE when measured from a viewing angle of 0° by (0.01, 0.01)-(0.05, 0.05).

18. The device of claim 1, wherein the CIE of light emitted by the device when measured from a viewing angle of 60° differs from the CIE when measured from a viewing angle of 0° by less than (0.01, 0.03).

19. The device of claim 11, wherein the microcavity has a finesse of at least about 5.

20. The device of claim 11, wherein the microcavity has a finesse of about 5 to 100.

21. The device of claim 11, wherein the CIE of light emitted by the device when measured from a viewing angle of 60° differs from the CIE when measured from a viewing angle of 0° by (0.01, 0.01)-(0.05, 0.05).

22. The device of claim 2, wherein the CIE of light emitted by the device when measured from a viewing angle of 60° differs from the CIE when measured from a viewing angle of 0° by less than (0.01, 0.03).

* * * * *